United States Patent [19]
Wainer et al.

[11] 3,929,483

[45] *Dec. 30, 1975

[54] METAL-PLATED IMAGES FORMED BY BLEACHING SILVER IMAGES WITH ALKALI METAL HYPOCHLORITE PRIOR TO METAL PLATING

[75] Inventors: Eugene Wainer, Shaker Heights; Harold J. Quaintance, Fairview Park, both of Ohio

[73] Assignee: Horizons Incorporated, a division of Horizons Research Incorporated, Cleveland, Ohio

[ * ] Notice: The portion of the term of this patent subsequent to July 2, 1991, has been disclaimed.

[22] Filed: Jan. 18, 1974

[21] Appl. No.: 434,537

Related U.S. Application Data

[62] Division of Ser. No. 191,635, Oct. 22, 1971, Pat. No. 3,822,128.

[52] U.S. Cl. ............... 96/38.4; 96/48 PD; 96/60 R; 427/96; 427/97; 427/98; 427/265; 427/287; 427/328; 427/404; 427/405; 427/437; 428/457; 428/901 UX

[51] Int. Cl.[2] ...................... G03C 5/00; G03C 11/00; G03C 5/24;G03C 5/32

[58] Field of Search ..... 96/38.4, 86 R, 36.2, 48 PD, 96/60 R; 117/71 M, 130 E, 50 R, 213 R, 230 R; 427/96–98, 265, 287, 328, 404, 405, 437; 428/457, 901 UX

[56] References Cited

UNITED STATES PATENTS

| | | | |
|---|---|---|---|
| 2,494,765 | 1/1950 | Kienast | 96/60 R |
| 2,766,119 | 10/1956 | Freedman et al. | 96/86 R |
| 2,854,386 | 9/1958 | Lyman et al. | 96/60 R |
| 2,942,973 | 9/1960 | Patrick | 96/38.4 |
| 3,033,765 | 5/1962 | King et al. | 96/36.2 |
| 3,464,822 | 9/1969 | Blake | 96/38.4 |
| 3,600,185 | 8/1971 | McGuckin | 96/36.2 |
| 3,615,483 | 10/1971 | Jonker et al. | 96/38.4 |
| 3,615,553 | 10/1971 | Wainer | 96/86 R |
| 3,637,386 | 1/1972 | DeRuig et al. | 96/60 R |
| 3,647,450 | 3/1972 | Calligaris et al. | 96/50 |
| 3,674,485 | 7/1972 | Jonker et al. | 96/38.4 |

FOREIGN PATENTS OR APPLICATIONS

| | | | |
|---|---|---|---|
| 1,064,725 | 4/1967 | United Kingdom | 96/38.4 |
| 1,064,726 | 4/1967 | United Kingdom | 96/38.4 |

*Primary Examiner*—David Klein
*Assistant Examiner*—Richard L. Schilling
*Attorney, Agent, or Firm*—Lawrence I. Field

[57] ABSTRACT

A novel product or radically increased photographic speed, photographic density and contrast is comprised in part of a silver image produced by photographic and/or other radiation techniques, or a silver image formed by radiation and having silver added thereto by physical development with reagents containing silver, or a silver image produced by adding silver to a select area through photoresist techniques, and/or a silver image produced by stencil and printing techniques; and plating thereon in only the silver image areas, metals taken from the group comprising nickel, cobalt, iron, copper, chromium, gold, silver, platinum, and palladium and mixtures thereof. Silver images are the preferred base and nickel is preferred plating material. However, gold, palladium and platinum may be used as the base for the selective plating of nickel or other metals noted above.

In a useful variation of the invention, one-sided and/or two-sided plated through conductive circuit boards useful for printed circuits may be produced by the techniques of the invention without the need for use of a photoresist.

7 Claims, 11 Drawing Figures

METAL-PLATED IMAGES FORMED BY BLEACHING SILVER IMAGES WITH ALKALI METAL HYPOCHLORITE PRIOR TO METAL PLATING

This application is a division of application Ser. No. 191,635, filed Oct. 22, 1971, and now U.S. Pat. No. 3,822,128.

BACKGROUND OF THE INVENTION

Methods for producing images on selective surfaces cover an exceptionally wide scope and the majority of such methods are well known. Among the most important of these reside in the arts and sciences of silver-halide photography, printing and lithography, and photomechanical techniques involving the use of a photoresist to etch away selected portions leaving an image producing member as the residual.

Since the art and science of silver-halide photography or silver chemistry photography is the most important relative to the full utilization of this invention, which silver photo-chemistry invariably results in the formation of an image containing silver or one of its compounds, this background will be described in some detail. Any photographic, photomechanical, and/or printing technique yielding an image containing silver is useful for the purposes of practicing the invention.

Probably the most well known image producing system in common use today are silver based systems for the production of images by electromagnetic radiation covering a wavelength range from the infrared to the x-ray region. Such systems are also sensitive to corpuscular radiation, such as electrons and alpha particles. In general, these materials are comprised of a dispersion of silver-halide crystals in a gelatin matrix, along with other additives utilized for imparting stability, spectral sensitivity, and specialized photographic properties. In exposing such a system to light or other radiation of suitable intensity, the photochemical decomposition usually takes place at high efficiency in which generally one silver atom is produced for each grain of silver halide present in the emulsion, providing the radiation energy is completely absorbed by the silver-halide crystal. The effect of the presence of this silver atom is then amplified by the process of chemical development in which the entire grain containing such initially light produced silver atom is transformed into metallic silver and the photographic speed of the plate is then determined, in effect, by the size of the grain of the silver-halide crystal. In view of the large variation in sizes used for specialized purposes in the field of photography, the number of atoms of silver produced by the process of chemical development may vary from a few tens of thousandths to several billions of atoms of chemically developed silver atoms for each atom of silver initially produced by the action of the impinging radiation. This means that the effect of the light quanta originally striking the photosensitive surface is multiplied by the number of silver atoms produced in the chemical development process. Thereafter, the image itself is fixed in specialized solutions, normally containing thiosulfates, which will remove the silver halide which has not been affected by light, leaving the metallic silver images fixed in emulsion. After suitable washing and drying, a permanent record is obtained of the radiation pattern which has struck the surface.

The foregoing description represents by far the most common means of producing an image comprised of silver as a consequence of radiation, and is the most useful one for the purposes of this invention.

Images can also be produced from light sensitive salts of other metals but at much reduced efficiency. There are the metals taken from the group gold, palladium, platinum, and sometimes copper. While it is possible to make images from these types of systems which are comprised similarly to those based on silver, relatively exceptionally long exposures are required since not only is the initial light receiving process an inefficient one as far as producing metal atoms of this latter group is concerned, but the process of development is equally inefficient. Nevertheless, image systems producing the metal or compound of gold, palladium, platinum and/or copper are also useful for the purposes of this invention.

Another process for placing silver in a light produced image is termed "silver intensification or physical development". In the chemical development described in preceding sentences which produce a huge number of silver atoms for each atom of silver present as a consequence of the initial photochemical reaction, the developing solutions are comprised primarily of alkaline reducing agents which normally do not contain metals other than the alkali metals. In a variety of photographic processes, including those which produce silver in the initial light reaction, the image is developed out or intensified by solutions which contain silver salts. This process is normally designated as "physical development", and as further indicated, this process of physical development utilizing silver salts may be applied to a host of photographic systems whether these photographic systems initially contain silver or not. One such silver containing development or intensifying solution is designated as "Kodak In-5" and is described in detail on page 3315 of the Fortieth Edition of the "Handbook of Chemistry and Physics" published by The Chemical Rubber Publishing Company of Cleveland, Ohio, in 1958. This intensifying composition consists chiefly of a mixture of silver nitrate, silver sulfite, sodium thiosulfate, and Elon (Eastman Kodak), or sometimes metol plus hydroquinone. The majority of such tradename materials are substituted phenols. Sometimes carefully buffered acid silver nitrate solutions in water containing an organic reducing agent are utilized for this purpose, and, in other cases, ammoniacal silver nitrate solutions are utilized as described, for example, on page 825 of the book "Aluminum and Its Anodic Oxidation" by M. Schenk, published by A. Francke of Berne, Switzerland, in 1948; this particular physical developer utilizes a mixture of silver nitrate and borax in water solution in which the precipitate formed as a consequence of such mixture is dissolved by adding ammonia water dropwise.

The principal feature of such physical development technique is the relatively low efficiency of the development process for the purpose of magnifying the effects of the original photochemical action as induced by the impinging radiation. In spite of this inefficiency, appropriate use of this technique is of exceptional importance for the purposes of the present invention.

The usual multiplication of the effect of the original photochemical reaction by physical development techniques is generally a factor of 25 with a usual range of between 10 and 100 as against a factor of several millions for the chemical development process. Nevertheless, in spite of this low efficiency, this physical development process has been utilized commercially not only for intensification of images produced by normal silver-halide photography but for a number of initially non-silver containing systems. Silver intensification procedures have enabled certain non-silver containing systems to achieve some degree of commercial acceptability in spite of the relatively slow and inefficient photographic performance. For example, systems based on the light sensitive properties of ferric ammonium citrate may be physically developed with a silver containing solution so as to render the system suitable for a slow speed contact printing material. Other light sensitive sources of such metals as manganese, cobalt, copper, cerium, molybdenum and tungsten are handled similarly. Variations of these compositions involve the combination of citrates, or other weak organic acid salts of these light sensitive metals, in the presence of silver salts during exposure, followed by physical development with a silver containing medium. Silver citrates are commonly used for printout papers which may be developed either physically or chemically.

It is emphasized that while relatively little silver is present in these slow speed systems or added in the physical development step, the image produced does contain silver and thus, by definition, is suitable for the purposes of the invention hereinafter described.

An ingenious variation of this approach is the use of photoconductors, generally inorganic and sometimes organic, dispersed in a hydrophilic colloid, which exhibits the property of swelling but not dissolving readily in water. One example of this type of photographic system is designated a "RS" as manufactured by the Itek Corporation of Lexington, Massachusetts. In this particular case, the photoconductor is generally finely divided titanium dioxide dispersed in a hydrophilic colloid. If allowed to stand in the dark for a significant period of time, the photoconductor becomes light sensitive and on exposure to light produces active centers. A latent silver image is then produced from these active centers by bathing the thus exposed sheet in a water solution of silver nitrate in a range of 0.5 normal to 3.0 normal. Washing to remove the undecomposed silver nitrate, the system is then physically developed with a silver containing solution as described previously. The expected multiplication takes place and a fairly high speed contact printing medium is thus made available. This system is also useful as a base for the present invention.

Another recent development in the art of silver-halide technology, producing a suitable substrate for the practice of this invention, is the type designated as "dry silver". This material contains a silver-halide system which is thermally unstable above a certain temperature. On exposure to light, a latent image is produced and the image is then developed out simply by heating into a certain narrow temperature range. At this temperature range, the latent image is developed by continued decomposition of the excess of silver salts present in the emulsion at a fairly good photographic speed. If heated much above the narrow temperature range specified for the film, the entire film will fog. It appears that during the heating process, the silver atoms produced as a consequence of the initial exposure act as a catalyst for a much more rapid decomposition of the surrounding silver salts for the formation of the image than the normal decomposition rate for complete fogging if the system is heated to too high a temperature.

Photosensitive silver-halide systems which do not contain gelatin may be produced by vacuum evaporation of a silver halide, or by similar evaporation of metallic silver, followed by treatment with an appropriate halogen gas at a suitable temperature. These high resolution slow photographic systems are particularly useful for the purposes of this invention.

Silver images may be made by printing and/or lithography in which the ink utilized for the purpose contains significant proportions of metallic silver. A simpler technique and particularly from the standpoint of the present invention is the use of silk-screen printing in which a broader range of composition can be used than is common in the field of printing and lithography. For example, finely divided metallic silver dissolved in a hydrophilic colloid, such as gelatin, polyvinyl alcohol, polyacrylamide, and the like may be considered for this purpose with the image thus produced being ready for the purposes of this invention, once the screen processed ink has been laid down on a suitable surface and then dried.

The desired silver images may be produced by photomechanical techniques. In this case, a photoresist is used and may be laid down on a surface which is absorptive with regard to silver salts. The photoresist on such a surface is then exposed to light through a negative and the portions not struck by light are removed by washing in a suitable solvent. This leaves a resist image on top of the surface where light exposure has taken place and no resist on the surface where the resist has been removed by washing in the solvent. Thereafter, the sheet is soaked in a fairly concentrated solution of silver nitrate for a sufficient period of time, washed briefly with water, the excess water is squeegeed off and the silver salt held by the absorptive medium reduced to metallic silver by a treatment either with a standard developer solution or with a suitable reducing agent of the type known to those skilled in the art. The photoresist is then removed, if desired, by treatment with an appropriate solvent, leaving the desired silver image in the absorptive medium. A variation of this procedure involves pretreatment of the absorptive medium with a catalyst for the electrolytic deposition of silver, whereas the resist does not contain such catalyst. After exposure to light and removal of the resist in those areas where the light has not struck the resist, the system is then treated with an electroless plating bath which deposits silver on such catalyst and the image built up in those areas not protected by the resist. Again, the resist may be removed finally from the surface by washing with an appropriate solvent and a relatively heavy silver image remains in the desired portions of the plate.

By applying a resist in the manner described to an absorptive medium such as anodized aluminum, the silver nitrate which is put into the pores goes only into those areas where the resist has been washed off and will not be absorbed by the photoresist layer which is left on the specimen. Thus, when the silver left in the specimen is developed by the use of developing agents or reducing agents, a positive image is obtained and after removal of the resist only those portions which contain the positive image reduced silver will be susceptible to subsequent metal plating.

While many surfaces will absorb silver nitrate from water solution, such as water swellable hydrocolloids taken from the class of gelatin, polyvinyl alcohol, hydroxy-alkyl celluloses, casein, gun arabic, and the like, a most interesting and commercially useful surface for the purpose particularly with regard to the absorption and decomposition of silver salts therein, is the porous surface produced by the anodizing of aluminum, as a consequence of the peculiarly avid absorptive properties of the anodized layer on aluminum.

Several varieties of photosensitized aluminum anodized layers are known of which at least one is being produced in significant quantities for commercial use today. In view of the fact that all of these varieties are suitable for the purposes of the invention, the background relative to this item will be described in some detail. The term "silver salt absorptive surface" used in previous portions of this description applies particularly to the anodized layer which is placed on an aluminum sheet by suitable electrolytic techniques well known to those skilled in the art.

While a variety of light sensitive salts have been utilized to sensitize the anodized layer of aluminum for producing a contact printing medium (and some of the known silver varieties will be described in the examples which follow), the principal utility has been found through sensitization with silver salts. One early utilization of this medium as a base for silver-halide photography was developed by Siemens and Halske and is described in German Pat. Nos. 607,012; 608,270; 615,692; 619,450; 620,664; and 662,480. The product made under these patents enjoyed limited commercial usage under the tradename "Seo-Foto". These were generally manufactured by impregnating the anodized layer first with a solution of silver nitrate of suitable concentration, wiping off the excess silver nitrate solution, followed by a solution of an alkali halide salt and again wiping off the excess and then permitting the plate to dry. If used within a few hours after its preparation and drying, the plate produced rather excellent results as a printing medium but at relatively slow speed. This plate suffered from the disadvantage, however, of premature fogging and the development of spot defects, particularly if stored for longer than 24 hours. It will be noted that no gelatin was utilized in the preparation of this type of plate.

A variation of this type of plate was developed in Switzerland about 1950 and tradenamed "Aluphoto". In this particular case, the anodized layer was first impregnated very deeply with a water soluble salt of a dye, usually of the sulfonated or halide variety. After the dye was absorbed as completely as possible by the anodized layer, the plate could be washed thereafter in water without removal of the dye, thus indicating the firm bonding of the dye to the pores of the anodized layer. Thereafter, the dried plate was bathed in a water solution of silver nitrate for an extended period of time and as a consequence of the metathetical reaction between the inorganic anionic portions of the dye and the silver nitrate solution, silver in the form of the relatively insoluble salts (either sulfate or the more insoluble halide) mixed with metallic silver was deposited in the pores and fixed therein. Thereafter, the plate was washed with water under which action the dye washed out, leaving the silver and its insoluble salts behind. The wet plate in this condition was then treated with chlorine water to transform the silver salts remaining in the pores to a light sensitive silver halide. The plate was again washed and dried and was ready for exposure. Though somewhat higher concentrations of silver could be placed in the pores than by the "Seo-Foto" technique, the "Aluphoto" plate again suffered from the defects in that the plates had very limited shelf life, were subject to fog and showed on regular occasions defects caused by interaction with pores in the anodized layer which were open to the bare metal. In view of the extremely short shelf life, the sensitized plate had to be prepared in the darkroom just prior to use.

A stable variety of silver-halide impregnated anodized layers utilizes gelatin in its manufacture, coupled with the usual double decomposition reaction taking place in the pores. This product is tradenamed "Metalphoto" and is described in U.S. Pat. No. 2,766,119. This product exhibits a shelf life in the dry form for periods of years, is free from premature fogging defects, and from random spotting defects which typified both the "Seo-Foto" product and the "Aluphoto" product.

The product described in U.S. Pat. No. 2,766,119 exhibited a significant increase in photographic speed over those available from the prior art, such as typified by the "Seo-Foto" or "Aluphoto" product. A product which exhibits a further marked increase in photographic speed is described in U.S. Pat. No. 3,615,553 issued Oct. 26, 1971. Again, a double decomposition reaction is utilized except that the reagents, particularly the silver nitrate, are carried into the pores in an alcohol containing medium. While gelatin is still utilized, the gelatin concentration may be reduced substantially, if desired, below that described in U.S. Pat. No. 2,766,119. The improved speed described in U.S. patent application Ser. No. 35,262 may be still further increased and particularly for the purposes of this invention by multiple impregnations. Thus, the speed goes up by a factor of 10 if the plate is impregnated twice and by a factor of 100 if the plate is impregnated three times.

In producing silver containing images on anodized aluminum from silver alone, the color rendition normally obtained is quite brown and it is a general practice in the industry to tone the image to change the color to a black through the medium of the well known technique designated as "gold toning". A significant exception to this brownish rendition is obtained through the practice described in the above noted U.S. patent, particularly if the ingredients used to form the silver-halide composition in the pores are squeegeed into the surface of the material with light pressure either by roller or squeegee techniques.

Thus, in summary, it may be stated that any image forming system irrespective of the manner in which an image is formed which contains silver or a silver salt or a combination thereof is a suitable basis for the proper practice of this invention and for the production of the novel products hereinafter described.

SUMMARY OF THE INVENTION

A silver image made by photographic or any other means containing not less than 67.5 percent by volume of metallic silver and not more than 32.5 percent by volume of a carrying agent, such as a solvent available colloid selected from the group consisting of gelatin, polyvinyl alcohol, polyacrylamide, other resins or plastic materials, is first bleached by a brief treatment in a water solution of an alkali hypochlorite, after which metal is plated on the bleached image by the medium of an electroless plating bath containing at least one salt of at least one metal selected from the following:

nickel, cobalt, iron, copper, chromium, gold, silver, platinum, palladium and mixtures thereof. When the relative silver carrying agent ratios recited in the previous sentence exhibit a silver content of less than 67.5 percent by volume, as is usual in the majority of silver-halide photographic surfaces, the silver content of such silver images can be advantageously built up to the desired level by silver intensification techniques using procedures well known to those skilled in the art.

The anodized layers on aluminum which are photosensitized with silver salts and/or are developed with reagents which contain silver are particularly suited to the purpose of this invention.

As a consequence of the use of these procedures, a novel product is obtained which comprises a silver image having plated thereon another metal. This novel product exhibits radically increased photographic speed, radically increased gamma, and a much higher photographic density and contrast than that originally available from the image first produced. In addition to the above product, another novel product may be produced by the practice of this invention by using photosensitized aluminum which has been anodized and photosensitized on both sides. This aluminum plate is prepunched to yield holes in desired locations and then anodized and photosensitized after such prepunching. By proper utilization of the practice of this invention, not only is a plated-through circuit board made available for printed circuit purposes but printed circuit registry may be laid down on both sides of the board without the intervention of a photo-resist. Single-sided printed circuits may also be produced without the use of a photoresist.

Electroless plating baths which are neutral or acid in character are generally suitable for the purposes of this invention. However, the majority of electroless copper plating baths are strongly alkaline in nature due to the presence of considerable amounts of sodium hydroxide. Such alkaline baths not only destroy or soften irretrievably the gelatin carrying agents normally used in most silver-halide photographic systems, but also dissolve the aluminum hydroxide of the anodized layer on aluminum, thereby defeating the end purpose desired. In the present invention, copper is deposited from specialized electroless plating solutions, which are acid, or preferably, certain modifications of the highly alkaline copper baths may be utilized for circumventing the difficulty described previously. These modifications represent another aspect of this invention.

It has been found that if 10 percent or more of the water used for making up these strongly alkaline copper deposition baths containing sodium hydroxide is replaced with an alcohol selected from the group consisting of methyl alcohol, ethyl alcohol, and isopropanol, that the deleterious attack on either gelatin or the anodized layer is prevented. Further, it also has been found that if the sodium hydroxide is replaced with a strong organic base, such as guanidine carbonate, that not only can the pH normally produced with sodium hydroxide be obtained, but again the deleterious effect of the strong alkali on the gelatin and/or the anodized layer on aluminum is prevented. A further technique for achieving high basicity in copper electroless plating baths and also eliminating the deleterious effect of this highly basic condition on gelatin, or on other hydrophilic colloids or on the anodized layer on the aluminum is the use of a di-polar aprotic solvent in the place of water in whole or in part for the preparation of such copper plating baths. Such a solvent may be defined as one having a dielectric constant greater than 15 and may be taken from the group consisting of dimethylsulfoxide, dimethylformamide, and hexamethylphosphoramide.

Summarizing, one novel product of this invention permits the obtaining of images, particularly photographic, made by whatever technique which permits these images to contain silver, of radically increased photographic speed, increased gamma, and contrast over identical systems which are not treated by the practice of the invention. Such novel products involve the practice of metal plating by electroless plating bath techniques utilizing such silver images on a substrate.

DEFINITIONS

A number of terms used in this specification require definition for the purposes of this description. These are the following:

1. Photographic Density

This is the diffuse transmission optical density as measured by a properly designed densitometer which yields the information on a log to the base 10 scale. For example, an optical transmission density of 1 holds back 90 percent of the light impinging on the image and transmits 10 percent; an optical transmission density of 2 holds back 99 percent of the light impinging on the image and transmits 1 percent; whereas an optical density of 3 transmits 0.1 percent of the light impinging on the image and holds back 99.9 percent. The measured amount of light transmitted through a densitometer is usually picked up by a properly calibrated photocell. Specialized densitometers, generally in the form of extremely sensitive spectrophotometers, are capable of measuring optical transmission densities up to a figure of 6 and although somewhat inaccurate on a quantitative basis, they are indicative on a qualitative basis above an optical transmission density of 4. Consequently, when a figure is given in the examples as "above 4", this means that the optical transmission density of the image is between about 4 and 6 and probably higher.

2. Contrast

Contrast is defined as the difference between the maximum optical transmission density of the image and the optical transmission density of the non-image areas.

3. Gamma

Gamma is defined as the slope of the straight-line portion of the curve obtained as a consequence of plotting the log of the exposure in millijoules per square centimeter for a specific wavelength of light or other radiation used for the purpose against the optical density. Generally, the higher the gamma, the higher the contrast of the image obtained.

4. Photographic Speed

Photographic speed in this document is defined as the amount of energy in millijoules per square centimeter required to yield a contrast equal to a density of 1.0 or, in other words, a difference between maximum density and minimum density as defined previously of 1.0.

5. Millijoules

A millijoule is one thousandth of a joule. Standard tables provide the conversion units for transferring joules, or millijoules, into quanta or light units.

THE ELECTROLESS PLATING BATHS

With certain significant exceptions, commercially available electroless plating baths are suitable not only for photographic purposes but also for the preparation of printed circuits of both the one-sided and the plate-through type, as will be defined for aluminum which is relatively thickly anodized on both sides and on holes through the aluminum circuit board. These commercially available baths are particularly suitable they are stable over a long period of time, are inexpensive to operate and maintain, and provide a wide latitude and development rate depending on various factors, such as concentration, temperature, pH and the various reducing agents employed, as well as the complexing agent utilized. For example, it has been found that the rate of electroless nickel development upon the photographically produced silver image embedded within an anodized aluminum porous layer is strongly dependent upon the reducing agent employed. The amine boranes are much more sensitive than the traditional hypophosphite reducer, although if lengthy times of the immersion are feasible, the hypophosphite baths yield results comparable to those which operate in the absence of hypophosphite baths.

In order to define the breadth of electroless plating baths which can be utilized for the purpose of this invention, reference to the open patent literature will be given an an indication of the types of baths utilized will be made. As indicated, the significant exception to the baths employed is the case of copper and this change in the constitution of the copper bath constitutes novelity for the purposes of this invention.

U.S. Pat. No. 3,432,338 defines baths capable of depositing the hypophosphites of nickel, cobalt, or an alloy of nickel and cobalt by utilizing a mixture of nickel fluoborate, sodium citrate, sodium acetate, and sodium hypophosphite. When cobalt or nickel cobalt alloys are deposited, the respective metal salts of the fluoborates are employed.

As indicated earlier, baths containing amine borane reducing agents deposit essentially pure nickel (and/or cobalt and copper) more rapidly than the hypophosphite baths. As defined in U.S. Pat. No. 3,431,120, the nickel, cobalt, or copper are provided as the sulfate, sulfamate, or chloride and utilized in a mixture of carboxylic acid salts and alkylamine boranes. The advantage of this bath is that the pH is maintained between 3.5 and 7 and the plating may be carried out at temperatures ranging between 15° and 85°C. This bath comprises a mixture of nickel sulfate, acetic acid and methylamineboranes. Usually the bath is started by adding enough acetic acid to yield a pH of 7 and as it is continued to be used, the pH drops somewhat and the bath is normally replenished for continued use by adding a mixture o. nickel sulfate and alkylamineborane at a somewhat higher content that normally used in starting the bath. While the plating defined in the patent states that it can be carried out at temperatures ranging between 15° and 85°C, in the examples which follow, the use temperature is between 65° and 75°C, so as to cause the plating to take place at a more rapid rate, which it does than if the bath is used at a lower temperature.

U.S. Pat. No. 3,438,798 describes hypophosphite type of baths for the deposition of nickel, iron and cobalt which have the advantages for the purposes of this invention of operating at or near neutrality and at room temperature, preferably below 120°F.

U.S. Pat. No. 3,441,428 describes room temperature baths depositing nickel which exclude the use of sulfate and chloride ions, these sometimes interfering with the obtaining of proper conductivity on printed circuits.

U.S. Pat. No. 3,446,657 describes cobalt depositing baths which operate slightly basic but significantly this basicity is produced with ammonium hydroxide. The cobalt deposits in the form of the hypophosphite and the baths are slightly basic. The advantage of the ammonium type of bath is that it does not attack either the anodized aluminum layer or a gelatin to any marked extent during the deposition.

U.S. Pat. No. 3,300,328 describes a bath for the electroless deposition of gold.

U.S. Pat. No. 3,418,143 describes a very slightly basic bath, also useful for the purposes of this invention, for the electroless deposition of palladium.

U.S. Pat. No. 2,827,400 describes a bath useful for the purposes of this invention involving the electroless deposition of chromium.

One reference to the electroless deposition of silver has been given in the background section of this specification. Other references to the electroless deposition of silver are found on page 553 of the "Handbook of Photography" by Keith Henney and B. Dudley, McGraw-Hill Book Company, New York, 1939, and in the book "Photographic Chemistry, Vol. 1" by P. Glafkides, The Fountain Press, London, 1958, page 186.

It was pointed out in other sections of the description of this invention that substantially all electroless plating baths are suitable for the purposes of the invention with the exception of those which are exceptionally high in alkali hydroxides so as to possess a pH in the range of 11. These alkali hydroxides have a destructive and deleterious effect both on gelatin and on the anodized layers on aluminum with the end result that the desired product to be obtained by the proper practice of this invention is not available. It has been found that by replacing a significant portion of the water to make up the copper plating bath with an alcohol taken from the group consisting of methanol, ethanol, isopropanol and mixtures of such alcohols; the replacement of the sodium hydroxide in the formulation with an equimolal concentration of guanidine carbonate; and/or the replacement of all or part of the water with a di-polar aprotic solvent taken from the group of dimethylsulfoxide, dimethylformamide, and/or hexamethylphosphoramide makes such copper baths effective for the purposes of this invention. In addition, replacement of the sodium hydroxide in the presence of these di-polar aprotic solvents with tetramethyl ammonium hydroxide or trimethylphenyl ammonium hydroxide also permits a pH of 11 to be obtained easily and without the destructive effects on the absorptive substrate containing the silver image, e.g. the gelatin.

One known bath used for the purposes of electroless deposition of copper may be comprised as follows:

| | |
|---|---|
| copper sulfate ($CuSO_4.5H_2O$) | 14.6 grams |
| sodium hydroxide (NaOH) | 7.5 grams |
| Rochelle salts (sodium-potassium tartrate) | 7.5 grams |
| formaldehyde (37 percent solution) | 33.8 grams |

These salts are dissolved in water to make 1 liter and usually provide a pH in excess of 11.0. The novel techniques described leading to novel compositions for copper plating yield basicities and pH's in the same general range but without exhibiting the deleterious effects described heretofore.

There are specialized baths which are acid in character and suitable for the present invention and which have the capability for depositing copper at an extremely rapid rate. One such bath is comprised of 33 grams per liter of pentahydrated copper sulfate, 50 cc's per liter of sulphuric acid (specific gravity 1.84) as one part of a two part solution and the second solution comprises 500 grams per liter of sodium hypophosphite. Two volumes of the copper solution is utilized for each volume of the sodium hypophosphite solution. The two solutions are mixed just prior to use and the bath operates at 80°C. In a variation of this formulation, the copper sulfate-sulphuric acid solution is made up as before but in this case the second solution consists of 100 grams of sodium phpophosphite per liter. Again, two volumes of the copper solution is used per volume of the sodium hyposulfite solution. This is mixed just prior to use and the bath is operated at 80°C. Not only is the copper deposition in such a bath very rapid but the solutions do not exhibit deleterious effects either on gelatin or other hydro-colloids or on the anodized layer which has been photosensitized.

Having summarized the invention and defining the terms used therein, a series of examples will be given for establishing the breadth and scope of the invention.

In the examples which follow, the invention will be more fully understood from a consideration of the drawings accompanying this specification, in which.

Figure 1:
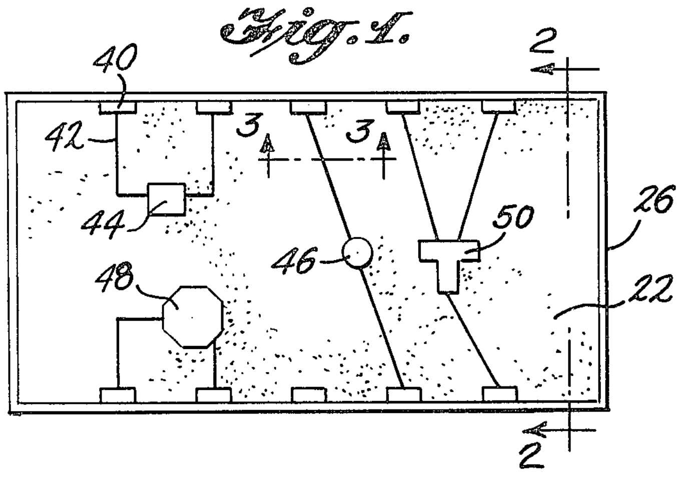
FIG. 1 is a plan view of a single-sided circuit board after exposure, development and fixing.

For each of the following examples involving formation of an anodized layer on aluminum and thereafter impregnating the anodized layer with photosensitive salts, identical techniques of anodizing and subsequent treatment after photosensitization, exposure and development were used throughout except as otherwise specifically noted. In the examples, smooth surface aluminum sheets were anodized in a bath containing 5 percent sodium oxalate and sufficient oxalic acid to yield a pH of 1. The anodization was carried out at a temperature of 55°C at a current density of 10 amperes per square decimeter and at 50 volts D.C. Under these conditions, in 20 minutes, a highly porous film measuring 0.0045 inches in thickness was obtained.

EXAMPLES 1–22

Examples 1 through 12 described in Table 1 were anodized in this manner and in each case impregnated with silver-halide salts in accordance with previously known and designated methods. In certain cases, the developed out and fixed image, generally brownish or sepia toned in nature, was gold toned to yield a warm black to blue black rendition, and such gold toned renditions are included in the table for purposes of comparison. The gold toning was carried out by a procedure well known to those skilled in the art, involving treatment of the developed out and fixed image of metallic silver with a water solution of a mixture of gold chloride and ammonium thiocyanate.

After the photosensitive salts embedded in the anodized aluminum layer are exposed to a suitable dosage of light, the image is developed out and fixed by standard techniques. Thereafter, the surface is treated in a bath of alkali hypochlorite containing 5 percent alkali hypochlorite for about 30 seconds at room temperature. Depending on the amount of silver present, the time of immersion may vary from 10 seconds to 200 seconds. The concentration of alkali hypochlorite may vary from 3 percent to 20 percent. At room temperature, these solutions tend to give off chlorine if the concentration of alkali hypochlorite is much above a range of 7 percent concentration. Thus the preferred range of concentration for a combination of good activity and stability is 4 to 7 percent of alkali hypochlorite with the temperature of treatment at 35°C or less.

Treatment of the developed out and fixed silver image with the 5 percent alkali hypochlorite is continued until the image is a pale yellowish white color.

After treatment in the hypochlorite solution, the surface is then immersed immediately in an electroless plating bath of choice. For the purposes of this invention, the immersion duration may be varied for achievement of varying contrast, gamma and speed. Generally, the longer the immersion of the base silver surface in the metal plating bath, the higher the gamma, the higher the contrast, the higher the optical transmission density and the higher the speed obtained. When the silver image is to be utilized as a basis for a printed circuit, the immersion in the electroless plating bath is generally continued until the bright, shiny luster of the pure metallic surface of the metal being plated out of the electroless plating bath is seen. Usually, the time for achieving an electrically conducting circuit is generally a factor of 2 to 5 times longer than that required to achieve a desired photographic result for the various baths mentioned in previous descriptions.

In order to obtain the transmission densities listed in the example for an anodized layer placed on aluminum, the various surfaces and images described in the examples are laminated to glass with an adhesive and the aluminum backing stripped off with an appropriate reagent, generally concentrated hydrochloric acid, as described in a co-pending application Ser. No. 205,493, describing an invention made by Harold Quaintance, filed Dec. 7, 1971.

Utilizing the anodizing conditions indicated previously, a thickness of anodized layer of 0.4 to 0.45 mils is usually obtained in about 20 minutes. The thickness obtained under fixed conditions of voltage, amperage and temperature is time dependent. By extending the time period to about 40 minutes, an anodized layer thickness of roughly 0.8 mils to 0.9 mils can be obtained. For the non-metal plated image, photographic speed, gamma and contrast increase markedly with an increase in thickness of the anodized layer. A further sharp increase in these factors is shown by metal plating on the silver image. Usually, for each doubling of the thickness of the anodized layer, the photographic speed increases by a factor of 6 to 10. These data are given in Examples 13 to 22 inclusive, in which the photosensitized layer was not gold toned and the properties with and without nickel plating as a function of thickness are shown.

After immersion for the stated time, the excess solution is squeegeed off the surface and the plate allowed to dry in the dark. The sensitized surface is then exposed to a 21 step (square root of 2) stepwedge in which the light source in the ultra-violet sensitometer was a medium pressure mercury lamp. After exposure, the plate is washed in water and then fixed by a further washing in a 2 percent sodium thiosulfate solution and the excess sodium thiosulfate removed by washing in water and the plate dried. The photographic properties obtained after following this procedure were the following: the color was sepia, the photographic speed was 700 millijoules per square centimeter, the gamma was 0.9 and the contrast was 1.4.

The plate was then soaked in distilled water for about 1 minute and then bleached for 30 seconds in a 5 percent solution of sodium hypochlorite at room temperature, after which it was immersed in the electroless nickel plating bath described in U.S. Pat. No. 3,431,120 for a period of 1 minute at 85°C. The photographic properties obtained after washing and drying were the following: the transmitted color was jet black,

TABLE 1

SILVER HALIDE PHOTOSENSITIZED ANODIZED ALUMINUM PLATES (PLATED WITH NICKEL)

| Example No. | Type | Speed Point (mj/cm$^2$) | Gamma | D-Max. | D-Min. |
|---|---|---|---|---|---|
| 1 | Seo-Foto Ger. Pat. No. 607,012 (gold toned) | 50.0 | 1.6 | 1.9 | 0.15 |
| 2 | Seo-Foto Ger. Pat. No. 607,012 (not gold toned) (1 min. nickel) | 0.005 | 5.5 | >4 | 0.20 |
| 3 | U.S. Pat. No. 2,766,119 (gold toned) | 3.5 | 0.75 | 1.4 | 0.10 |
| 4 | U.S. Pat. No. 2,766,119 (not gold toned) (1 min. nickel) | 0.7 | 2.2 | 2.6 | 0.15 |
| 5 | U.S. Pat. No. 2,766,119 (not gold toned) (5 min. nickel) | 0.1 | 4.0 | >4 | 0.22 |
| 6 | U.S. Pat. No. 3,615,553 (not gold toned) | 0.1 | 1.35 | 1.6 | 0.20 |
| 7 | U.S. Pat. No. 3,615,553 (gold toned) | 0.3 | 0.8 | 1.8 | 0.20 |
| 8 | U.S. Pat. No. 3,615,553 (not gold toned) (1 min. nickel) | 0.004 | 4.0 | >4 | 0.4 |
| 9 | U.S. Pat. No. 3,615,553 (not gold toned) (5 min. nickel) | 0.0004 | 7.0 | >4 | 0.5 |
| 10 | U.S. Pat. No. 2,766,119 (not gold toned) | 6.0 | 1.0 | 1.3 | 0.10 |
| 11 | (silver intensified) | 0.25 | 2.6 | 3.6 | 0.15 |
| 12 | (silver intensified plus 1 min. nickel) | 0.0005 | 7.0 | >4 | 0.22 |

TABLE 2

EFFECT OF THICKNESS OF ANODIZED LAYER (Photosensitized in Accordance with U.S. Pat. No. 3,615,553 (not gold toned); When Nickel Plated One Minute Immersion was Used)

| Example No. | Thickness of Anodized Layer | Nickel Plating | Speed Point (mj/cm$^2$) | amma | D-Max. | D-Min. |
|---|---|---|---|---|---|---|
| 13 | 0.1 mil | No | 8.0 | 0.9 | 1.5 | 0.10 |
| 14 | 0.1 mil | Yes | 0.2 | 1.7 | 2.2 | 0.15 |
| 15 | 0.2 mil | No | 0.75 | 1.1 | 1.5 | 0.15 |
| 16 | 0.2 mil | Yes | 0.03 | 2.7 | 3.2 | 0.18 |
| 17 | 0.4 mil | No | 0.13 | 1.30 | 1.5 | 0.20 |
| 18 | 0.4 mil | Yes | 0.005 | 3.9 | >4 | 0.4 |
| 19 | 0.8 mil | No | 0.02 | 1.6 | 2.0 | 0.3 |
| 20 | 0.8 mil | Yes | 0.001 | 5.9 | 4 | 0.45 |
| 21 | 1.6 mil | No | 0.003 | 2.6 | 2.9 | 0.4 |
| 22 | 1.6 mil | Yes | 0.0002 | 7.0 | >4 | 0.5 |

EXAMPLE 23

An anodized layer 0.45 mil in thickness on aluminum is impregnated for 1 minute with a solution comprised as follows:

| | |
|---|---|
| ferric ammonium citrate (green) | 20 grams |
| citric acid | 6.6 grams |
| silver nitrate | 6.6 grams |
| water | 500 cc's |

the photographic speed was 0.05 millijoules per square centimeter, the gamma was 3.8, and the contrast was 4.2 units of density.

EXAMPLE 24

In a variation of Example 23, the therein described anodized aluminum plate was impregnated with a solution of 2 grams of green ferric ammonium citrate and 0.7 grams of citric acid, dissolved in 200 cc's of water for a period of 2 minutes. The excess solution was squeegeed off and the plate dried thoroughly and then exposed in the ultraviolet sensitometer beneath a 21 step square root of 2 wedge and then developed in a 1 percent by weight solution of silver nitrate, washed, fixed in a 2 percent solution of sodium thiosulfate, again washed in water and dried. A brownish colored image of very low contrast and gamma was obtained which exhibited an extrapolated speed point of approximately 2000 millijoules per square centimeter to achieve a density difference of 1.0. After bleaching in the hypochlorite solution described before and then treatment in the electroless nickel deposition bath of Example 23 for a period of 5 minutes, the enhanced photographic results substantially identical to those defined in Example 23 were achieved.

EXAMPLE 25

A 0.45 mil thickness of an anodized layer on aluminum was impregnated with a solution made up as follows:

| | cc |
|---|---|
| potassium chloroplatinate (10 percent) | 250 |
| ferric oxalate (30 percent) | 100 |
| potassium chlorate (saturated solution) | 100 |
| oxalic acid (10 percent) | 10 |

This solution was then diluted to 1 liter with water and the anodized layer impregnated by soaking for 2 minutes after which the excess solution was squeegeed off the surface and the plate allowed to dry. The plate was then exposed to an ultraviolet sensitometer for a sufficient period of time (determined previously) to yield a light brown image under the stepwedge. The dried plate was then developed in the following solution:

| | |
|---|---|
| potassium oxalate | 70 grams |
| oxalic acid | 3 grams |
| disodiumphosphate ($Na_2HPO_4$) | 10 grams |

and water to make up 1 liter of solution. Development time was approximately 3 minutes, after which the specimen was washed and fixed in a 2 percent hydrochloric acid solution for 1 minute, and again washed in running water until all the hydrochloric acid is removed and the plate was then dried. A black image of beautiful tone was obtained with good contrast.

The photographic properties obtained as a result of this treatment were as follows: the energy required to yield a photographic transmission density of 1.0 was 3000 millijoules; the gamma was 1.3 and the contrast was 2.2. The image was deep black in color.

This photographic system based on the deposition of metallic platinum in the pores was treated as before utilizing the bleaching hypochlorite solution, followed by immersion in the electroless nickel plating bath defined in Example 23. This system is somewhat unusual in that the bleaching step is not entirely necessary though somewhat longer is required to yield the same results as when it is included. For example, in order to achieve the results set forth in the following paragraph, these results were obtained by deposition of metallic nickel from the electroless plating bath indicated for a period of 3 minutes, whereas without the bleaching step, the same results are obtained in approximately twice the time or approximately 6 minutes.

These results are as follows: the image was again a deep black in color, the photographic speed to achieve a density of 1 was 0.03 millijoules, the gamma was 2.9 and the contrast was 3.8.

EXAMPLE 26

Same as in Example 24, except that the potassium chloroplatinite solution was replaced with a 5 percent solution of palladium chloride. This system again exhibits about the same initial photographic speed as the platinum system after exposure, development and fixing and also after intensification of the nickel plating bath.

EXAMPLE 27

An anodized layer on aluminum of 0.45 mils in thickness is immersed for 5 minutes in a bath comprising as following: three separate solutions are made up. The first comprises 10 grams of sodium chloroaurate in 80 cc's of water. The second solution is 50 grams of ferric oxalate in 50 cc's of water, and the third solution is 50 grams of tartaric acid and 50 grams of potassium chlorate in 500 cc's of water. The ferric oxalate solution is added to the first solution and mixed thoroughly, then diluted with 500 cc's of water, after which the potassium chloratetartaric acid solution is mixed in slowly, with stirring. After a 5 minute impregnation, the excess solution is squeegeed off and the plate allowed to dry in the dark and then exposed to a suitable ultraviolet light source under a stepwedge. The image prints out and is developed for 2 minutes in a bath comprising 5 percent potassium oxalate in water, then washed in water and fixed in a 2 percent solution of hydrochloric acid, and washed until the hydrochloric acid is removed, after which the plate is dried. After transforming into a transparency, as described in the above noted application filed concurrently herewith, by one of the present applicants, the following photographic properties were obtained: the image was a warm black; the photographic speed was 4000 millijoules; the gamma was 1.0; and the difference between Dmax and Dmin was 1.5.

A similarly made plate was exposed to light as before, but after exposure through a negative, developing, fixing and washing with running water, was then treated with the nickel deposition solution for a period of 5 minutes without the intervening bleaching with sodium hypochlorite. The photographic speed achieved by this procedure was the following: the color was a deep lustrous black, the photographic speed was 0.1 millijoules; the gamma was 5.5; and the contrast approximately 4.

EXAMPLE 28

A 20 mil sheet of electrolytically polished aluminum is anodized to yield an anodized layer thickness of 1 mil. After washing and drying, it is then impregnated with silver salts in accordance with the description in U.S. Pat. No. 3,615,553. It is then exposed to ultraviolet light of suitable dosage so as to yield a good dense brownish-black image. The exposure is made through a photomask so as to yield a printed circuit in the anodized layer. After exposure, development, fixing and washing, the image is then bleached for 40 seconds in a 5 percent sodium hypochlorite solution at room temperature and then immersed in the nickel plating bath for 7 minutes. After washing and drying, a conducting circuit has been found to be obtained on the surface and the breakdown voltage between the front and back of the specimen is approximately 1200 volts per mil of anodized layer.

EXAMPLE 29

An anodized, silver-halide impregnated, exposed, developed, fixed and washed surface is prepared as before and again the silver image is bleached. The cooper sulfate containing bath described in the section entitled "Electroless Plating Systems" was utilized as the bath, except that it was dissolved in a mixture of 800 cc's of water and 200 cc's of methanol. A pH of 11.2 was obtained. After the silver image was bleached as before, the specimen was immersed in the cooper bath at 65°C for 30 minutes. Again, a conductive pattern was achieved on the surface of the anodized layer with a breakdown voltage of 1200 volts.

EXAMPLE 30

A copper plating bath was made up as described in the section entitled "The Electroless Plating Baths", except that the 7.5 grams of sodium hydroxide was replaced with 11.5 grams of guanidine carbonate. Using the bleached silver surfaces described in Examples 28 and 29, a 30 minute immersion in this bath produced a copper plate approximately 0.3 mils in thickness of good conductivity and current carrying capacity and again with a breakdown voltage of 1200 volts per mil being achieved.

EXAMPLE 31

Same as in Example 30, except that the same solids composition of copper plating bath listed in the section under "Electroless Plating systems" was utilized but in this case the salts were dissolved in a mixture of 500 cc's of dimethylformamide and 500 cc's of water. The plating time to achieve a thickness of copper on the bleached silver image of 0.3 mils required 20 minutes. Again, the pattern was conductive with good current carrying capacity and the breakdown voltage was 1200 volts per mil of anodized layer.

EXAMPLE 32

A bleached out silver image contained in the anodized coating was prepared as before, ready for the electroless copper plating. A electroless copper plating bath was made up in accordance with the formulation given in the section entitled "The Electroless Plating Baths", except that the sodium hydroxide content was replaced with 50 cc's of a 50 percent water solution of tetramethyl ammonium hydroxide. The bath was diluted to 1000 cc's with a mixture of 200 cc's of dimethylformamide and 800 cc's of water. This bath plated copper on the silver portions of the image to yield a conductive circuit with a breakdown voltage of 1200 volts. The copper plating was 0.4 mils in thickness after 30 minutes of immersion at 65°C.

EXAMPLE 33

An anodized layer 1 mil thick is prepared and after anodizing and thorough drying, the anodized layer is then coated with a photoresist designated as "Eastman Kodak's KPR". After suitable exposure to light, the resist is developed and processed in the usual manner and thoroughly washed to remove all traces of photoresist from the unexposed areas. The plate is then immersed in a 5 percent solution of silver nitrate in distilled water for a period of 5 minutes, after which the excess solution is squeegeed off and the plate is then allowed to dry. The plate is then developed with an alkaline solution of a metol-hydroquinone mixture. The plate is washed thoroughly to remove the developer residue and then bleached in the 5 percent sodium hypochlorite solution as heretofore described and the plating is for 3 minutes with the electroless plating bath described in Example 22. Since the plate was washed prior to the application of the nickel plating bath, all silver nitrate left on the exposed resist was also removed. The pattern used in this case was again the printed circuit pattern utilized in Example 28 and for printed circuit purposes, the photoresist either may be left on the surface or removed, if desired, by washing in the solvent recommended by the manufacturers of KPR (Kodak).

The foregoing represents an alternative technique for the manufacture of a printed circuit on anodized aluminum, without the use of photoresist salts but through the medium of the photoresist.

EXAMPLE 34

A two-sided circuit board based on the use of anodized aluminum is made as follows: a 20 mil thick sheet of electro-polished aluminum is punched appropriately to provide the passage between the front and back in the aluminum and it is then anodized simultaneously on both sides to approximately a 1 mil thickness of anodized layer on the surface. This provides an anodized layer in the holes of between 0.5 and 0.6 mils in thickness. This plate is then photosensitized in the manner described in U.S. Pat. No. 3,615,553 and is exposed to an appropriate pattern on both sides, using negatives which ensure that all of the holes are exposed to light also at the same time. After development, fixing and washing, the plate is then bleached with the 5 percent sodium hypochlorite solution for 30 seconds, followed by plating with metallic nickel with the bath described in Example 22 for a period of 5 minutes. After washing and drying, it was found that good electrical conductivity through the holes was achieved by virtue of availability of conductivity paths between the front and the back, the breakdown voltage between the front and the back between a conductor on the front and a non-conductor on the back was approximately 1000 volts per mil of anodized layer yielding a total breakdown of approximately 2000 volts per mil for the entire assemblage.

The principal significance of the examples dealing with printing circuits whether one-sided or plate-through two-sided is that these describe a procedure which eliminates the necessity for utilizing a photoresist for preparing a printed circuit.

EXAMPLE 35

A substantially gelatin-free silver halide photosensitive surface may be obtained by evaporating either silver bromide or metallic silver (subsequently converted to silver bromide by treating with bromine vapor) on a flexible substrate such as polyethyleneterephthalate. These materials are generally of contact printing speed or slightly better and typical photographic characteristics from layers which are approximately 1 to 2 microns thick are as follows: the photographic speed was 1 to 20 millijoules; gamma in the range of 1 to 2; contrast in the range of 1 to 2.

These images are ideal for the metal plate enhancement process defined in this specification. For example, after development and fixing, yielding the types of figures which have been described in previous sentences, bleaching with sodium hypochlorite for 30 seconds at room temperature and nickel plating for 3 minutes, the following photographic characteristics are achieved: speed 0.0005 millijoules; gamma 5.5; contrast above 5.

The system is unusual in that it is subject to great flexibility in the metal plating process. For example, it is possible to make flexible printed circuits by the described technique. Secondly, by varying the time of immersion in the nickel plating bath and coupled with modifications of the initial silver-halide development process, gamma variations from 2 to 9 can be achieved with contrast regularly above 3. Even with as short immersion time in the nickel plating bath as 45 seconds, an increase in photographic speed of a factor of 500 with highly useful gammas and contrast is readily obtained.

EXAMPLE 36

Results similar to those described in Example 35 for the evaporated silver bromide type of photographic system are obtained with the RS photoconductor-silver system manufactured by Itek of Boston. Under normal conditions of processing involving physical development (which brings metallic silver to the surface of the gelatin), the photographic speed is in the range of 1 to 5 millijoules, the gamma again is in the range of 1.5, and the contrast on full exposure and development around 2.

In applying the nickel plating process to a fully developed and fixed specimen representing an example of this stage of the art, the following photographic figures are obtained: the photographic speed is 0.0005 millijoules; the gamma is 5.5; the contrast is above 4; these results having been obtained as a consequence of a 5 minute immersion in the nickel plating bath heretofore described.

EXAMPLE 37

It has been stated in previous portions of this specification that the normal silver-halide type of photographic system dispersed in gelatin can, with certain manipulations, be made suitable for the purposes of this invention. If the usual silver-halide emulsion is developed in the usual chemical amplification mode to achieve the desired photographic speed, the images formed after development, fixing and washing will not respond to the nickel plating process described in this invention. However, if such an emulsion, after the normal chemical amplification development, is then physically developed in a silver type physical developer as referenced in this document, the initial photographic speed after chemical development is generally increased by a factor of about 25. This physically developed system after processing to achieve a stable image then can be metal plated as described in this specification.

Ideally, for this type of product, particularly with regard to radical increases in photographic speed, gamma and contrast types of emulsions generally described as "Lippmann Emulsions" or variations thereof (see: "Photographic Chemistry, Vol. 1", page 365, P. Glafkides, The Fountain Press, London, 1958) are preferred.

Lippmann emulsions and variations thereof of higher speed sometimes described as spectroscopic, astronomic, or process plates, are characterized by very low photographic speed, exceptional resolution capture capabilities, and extremely small photosensitive crystallite size. According to Glafkides, the diameter of the crystals in a Lippmann or similar type of emulsion is generally in the range of 10 to 50 millimicrons.

There are a wide variety of Lippmann emulsions with varying properties depending on how these are prepared and how they are photographically processed thereafter. The photographic speed of Lippmann emulsions and their variations will generally fall in a range of 0.1 to 5.0 millijoules; the gamma can be varied from less than 1 up to about 4; and the contrast from less than 1 again up to about 4.

A relatively low contrast type of Lippmann emulsion was utilized which, after the usual chemical development, exhibited a photographic speed of 3 millijoules; a gamma of 1.3; and a contrast of 2.1. This specimen was then physically developed in a silver bath as described on page 186 of Vol. 1 of Glafkides (vide supra). The photographic speed obtained as a consequence of the physical development was 0.04 millijoules; the gamma remained roughly the same or approximately 1.4, while the contrast achieved was well above 3.

After bleaching this image with a 5 percent solution of sodium hypochlorite in water for 30 seconds, and then nickel plating as described before for a period of 3 minutes, a radical change in photographic characteristics was obtained. The photographic speed was 0.0001 millijoules; the gamma was 6.5; and the contrast measured as accurately as possible with a combination of densitometers and spectrophotometers was between 5 and 6.

EXAMPLE 38

Ultrafine chemically pure silver powder exhibiting an average particle size of 1 micron heat treated in purified hydrogen for 1 hour at 350°C, cooled to room temperature in hydrogen, then transferred to a glove box, in which the atmosphere was pure dry argon. The specific gravity of the silver powder was then determined by liquid displacement techniques, utilizing pure benzene as the liquid, and the specific gravity was found to be 10.50. The remaining silver powder batch was retained in the argon atmosphere glove box.

Photographic grade powdered gelatin was heated at 50°C for 24 hours and while still above room temperature was transferred to the above described glove box. Using the same liquid displacement technique involving pure benzene, the specific gravity of this particular batch of gelatin was found to be 1.06.

Mixtures of gelatin, silver powder, distilled water and ammonium lignin sulfonate were made up as follows in the glove box chamber: the amount of gelatin recorded in Table 3 was placed in 10 cc's of water at room temperature and allowed to stand until the gelatin was completely swollen; for each composition listed in the table 90 cc's of water containing 0.1 gram of ammonium lignin sulfonate, said water solution being maintained at a temperature of 50°C, were then added to the gelatin solution and the solution was stirred until complete solution uniformity was achieved; finally, the amount of silver powder recorded in Table 3 was added slowly with stirring and the solution then allowed to cool at room temperature.

The ingredients used for preparing these mixtures are listed in Table 3 following.

TABLE 3

SILVER-GELATIN MIXTURES

| Run No. | Silver Grams | Silver CC'S | Gelatin Grams | Gelatin CC'S | Water (Total) (cc's) | Ammonium Lignin Sulfonate |
|---|---|---|---|---|---|---|
| A | 63.000 | 6.00 | 4.240 | 4.00 | 100 | 0.1 grams |
| B | 68.250 | 6.50 | 3.710 | 3.50 | 100 | 0.1 grams |
| C | 73.500 | 7.00 | 3.180 | 3.00 | 100 | 0.1 grams |

The stirred solutions were heated to 40°C and then spun coated on optically flat glass at 200 rpm. A smooth uniform coating was obtained by slow continuous pouring onto the spinning flat over a period of about 1 minute. The spinning was stopped 20 seconds after pouring was terminated and the spinning chamber was immediately flooded with air which had been cooled to 5°C. This treatment causes the solutions to gel and set firmly.

The samples were then allowed to air dry in a dust-free atmosphere for 2 hours and then heated at 50°C for 4 hours and then cooled to room temperature, in the dust-free atmosphere, a period of 30 minutes being allowed for the cooling operation.

Thereafter each specimen was treated at room temperature for 30 seconds in the 5 percent sodium hypochlorite solution, washed briefly in running water, and then treated in the amineborane type of nickel plating solution for 4 minutes.

The following results were obtained: no plating of metal was obtained on Run A from Table 3; very sparse and spotty plating, black in color where plating occurred, was obtained on Run B from Table 3; whereas a smooth uniform, shiny metallic film of nickel was deposited all over the gelatin surface of Run C which was electrically conducting. The transmission optical densities of Runs A and B were less than 1.5, whereas the optical density of Run C was in the region of 6, the limit of capability of the available measuring equipment.

Figure 2:
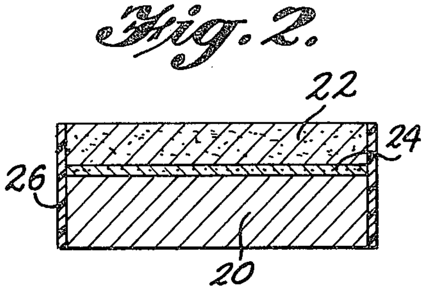
FIG. 2 is a fragmentary view in section taken along plane 2—2 of FIG. 1.
Figure 3:
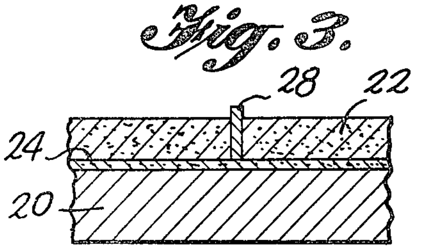
FIG. 3 is a similar view taken along plane 3—3 of FIG. 1.

FIGS. 1–3 show a single-sided circuit board fabricated according to the teachings of Example 28. The board includes the aluminum base 20 on which there is an anodized insulating layer 22. Between the metal base 20 and the porous anodized layer 22 is a barrier layer 24. The circuit board may be provided with a layer of epoxy or silicone insulating adhesive layer 26 which may be applied only to the edges of the circuit board or may, as preferred, extend all around the back of the exposed aluminum metal base 20. In FIG. 3, the numeral 28 identifies a solid deposit of nickel in a pore of the porous anodized layer 22.

Figure 4:
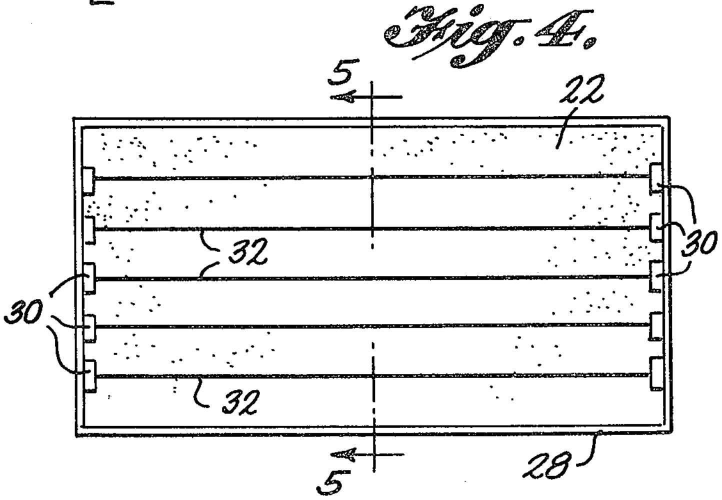
FIG. 4 is a plan view of a circuit board containing conductive circuits only.
Figure 5:
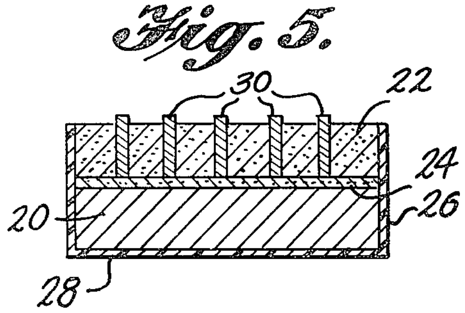
FIG. 5 is a fragmentary view taken in section along plane 5—5 of FIG. 4.

FIGS. 4 and 5 depict an extremely long circuit which might be 50 to 100 feet in length in a single piece. In the embodiment shown, soldered connections may be made to connect the circuit to other devices, through contacts 30 which are located at the ends of wires 32 and which are formed of solid nickel. The insulating resinous material 28 is shown not only along the periphery, but also over the back of the circuit board.

The article shown in FIG. 1 represents a finished article in which the conducting circuits are made in accordance with the teachings of Example 30. In FIG. 1, there is shown a conducting land 40 to which a soldering connection may be made at a later date, if desired. A line of conduction 42 leads to a component 44 and back to another conductive land. Component 44 may be a capacitor, a resistor, a diode, a transistor, or other component. Another kind of electrical component 46 may also be connected into the circuit board through the means of the conducting lines 44 and the conducting lands 40. A similar and possibly different electronic component 48 may be laid on top the circuit board which again is connected in the same manner as before. Still another type of electrical component, in this case designated as a transistor 50 may be connected as shown. As insulating surface 2 is provided by the anodized layer 22 on the aluminum base 20 which has not been metal plated as a consequence of the processing technique. An epoxy insulating layer 26 has been laid around the edge. On single-sided circuit boards, it may or may not be advisable to extend the insulating epoxy layer over the back of the circuit board since sometimes connections are desired to be made to the back of the board. When this is desired to be insulating, then the epoxy or silicone resin is applied as indicated in some of the sentences above.

FIG. 1 through 5 depict the articles obtained by the practice of Examples 28 through 32 and to some extent Example 33. However, Example 33 yields a positive rendition due to the use of a photoresist, whereas Examples 28 through 32 yield a negative rendition.

FIGS. 6 through 11 depict the two-sided circuit board produced according to Example 34. FIGS. 6 through 10 show the circuit board at various stages of completion. The metal base 20 is provided with an insulating anodized layer 22 through which a plurality of holes 60 are drilled, the holes being about 0.035 inches in diameter, for example. As in the previous embodiment, adhesive insulation 26 is placed around the edge of the panel. It will be understood that both the front and back surfaces of the base 20 are anodized, preferably in accordance with the procedure described in U.S. patent application Ser. No. 35,262. Anodizing and sensitizing are carried out on both the front and back and through the holes simultaneously so that the walls of the holes are covered with a porous anodized layer which is impregnated with photosensitive salts. In exposing the holes, usually an area somewhat bigger than the holes is exposed to ensure the formation of a conductive path through the hole.

Figure 6:
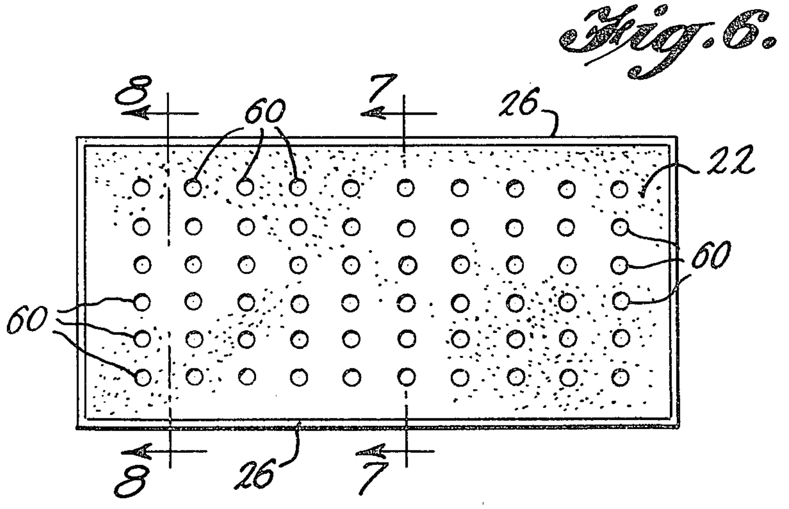
FIG. 6 is a plan view of a two-sided circuit board at an intermediate stage of its manufacture.
Figure 7:
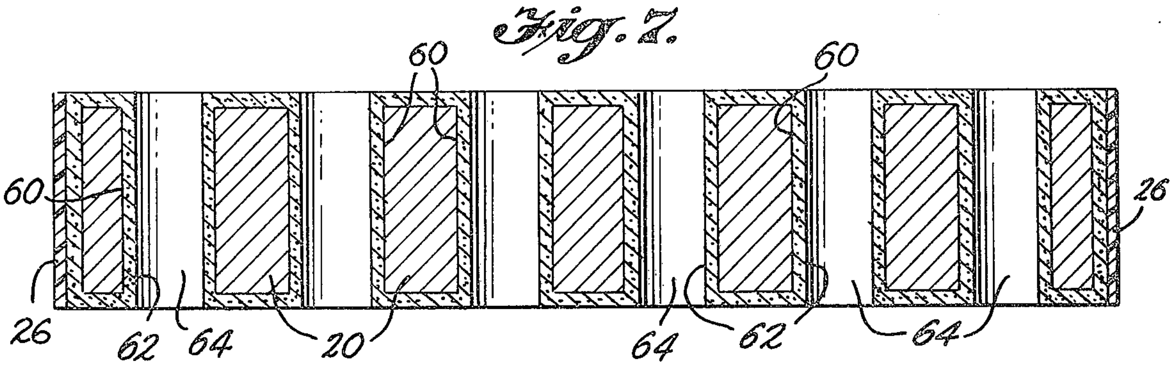
FIG. 7 is a view in section taken along plane 7—7 of FIG. 6.

Utilizing section 7–7 of FIG. 6 and turned 40°, the nature of the hole structure is shown in FIG. 7. The aluminum base 20 is covered by the anodized layer 62 now containing the photo-sensitive salts, prior to exposure. The rear 64 of the bore of the holes shown in FIG. 6 and the holes, as indicated before, are coated with a layer of anodized material 62 which has been impregnated with photosensitive silver salts.

Figure 8:
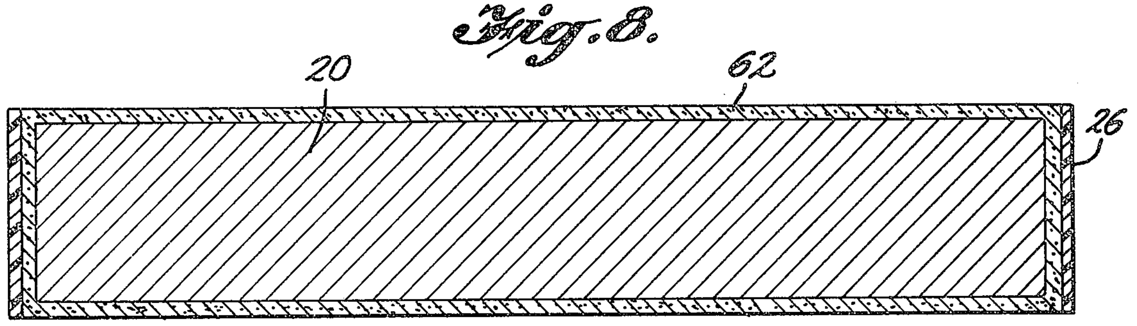
FIG. 8 is a similar view on plane 8—8 of FIG. 6.

FIG. 8 is the section 8–8 of FIG. 6 examined after turning 90°. Again, as before the anodized layer 62 contains the photosensitive silver salts is supported on the metallatic aluminum base 20 and the insulating epoxy or silicone resin 26 is applied to the edges of the panel.

Figure 9:
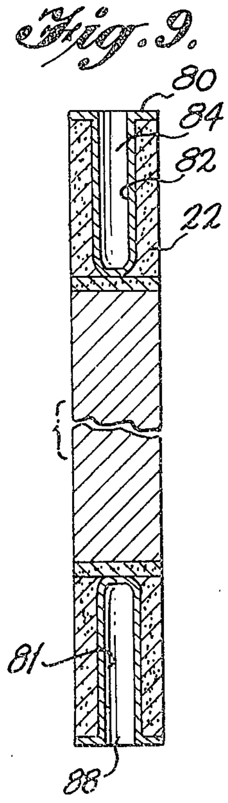
FIG. 9 is an enlarged fragmentary view of one pore on FIG. 8 at a later stage of manufacture.

FIG. 9 depicts a single pore, after the exposure, development, fixing and washing of Example 34. The outside diameter of the pore is approximately 0.13 microns with the inside diameter of the pore being approximately 0.10 microns and the thickness of the barrier layer being of the order of thickness of 0.05 microns. Specifically, 80 is the top of the pore and is lined with a thin layer of silver 81 which has been obtained as a consequence of the exposure and development operation. The pore wall 82 is lined with a thin layer 81 of silver; 84 is an empty space inside the pore. The wall 82 of the pore is originally comprised of aluminum oxide and a barrier layer 24 is disposed between the bottom of the pore and the metallic aluminum base 20. At the bottom surface of the assembly there is depicted a pore 88 lined with a small amount of silver 81.

Figure 10:
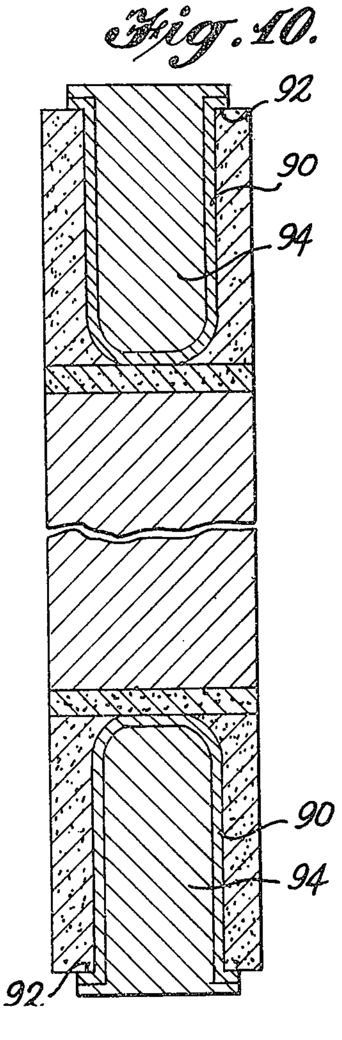
FIG. 10 is a view similar to FIG. 9 showing the pore after electroless deposition.

FIG. 10 is a schematic view of a single pore, after electroless plating has been completed, observed at 100,000X magnification in a scanning electron microscope. In this view may be seen the insulating aluminum oxide 22 which surrounds the pore, the lining 90 of silver around the edge of the pore and up on top to the land area 92 around the pore. As shown, the inside of the pore is completely filled with metallic nickel 94, and the nickel deposit extends somewhat above the plane of the top of the pore. The barrier layer beneath the pore is designated 24 and the base 20 aluminum as in earlier views.

Figure 11:
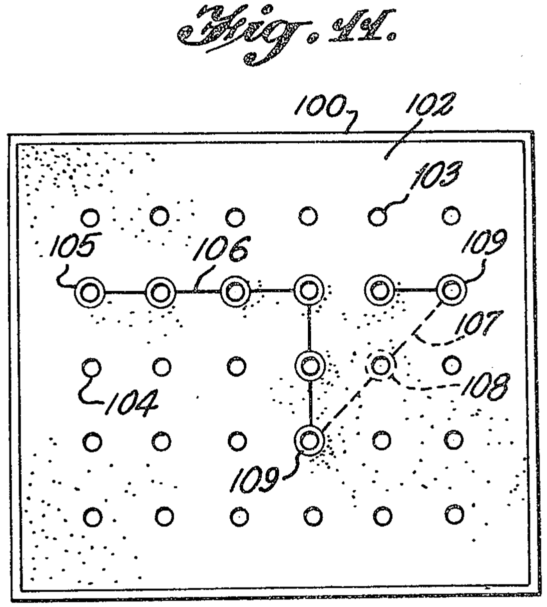
FIG. 11 is a view of the circuit board of FIG. 6 after it has been completed.

FIG. 11 depicts the product of Example 34 and shows a completed two-sided plate-through circuit board made in accordance with the directions given in Example 34. In FIG. 11, 100 is the insulating epoxy or silicone edge all around the panel. 102 is the insulating aluminum oxide surface made by anodizing which contains no metal, silver or other conductor therein as a consequence of the processing. 103 is a 0.035 inch hole which had been processed by anodizing and sensitizing as defined in Example 34 and the silver removed in the fixing process since this hole was not exposed to light. 104 is a similar hole. 105 is a plated-through hole made in accordance with the description given in Example 34 in which something of a conductive land has been placed around the hole as a consequence of the exposure. 106 is the conductive line which has been produced by the procedure defined in Example 34 required to yield a metallic line between the conductive lands surrounding the hole. 107 depicts a conducting line that has been placed on the back of the board and not on the front of the board, whereas 108 depicts a conductive land around a plated-through hole which is on the back of the board and not on the front of the board. 109 depicts a hole which has been exposed and plated-through on both sides and has lands on both sides.

The board is completed, usually when metallic pins of specialized design are forced through the holes in the board and project therefrom on both sides in the cases where the holes have been completely plated-through; the design of the pins being such that good electrical contact is made with the sides of the hole and with the lands simply by adequate contact pressure. These pins are then used as connecting posts to which other components may be wired either for placement or the surface of the board or for using the particular pin thus connected to the conducting circuit as a means of egress to other components outside the board.

We claim:

1. A product comprising a treated silver image on a base the surface of which comprises not less that 67.5 percent by volume of metallic silver and not more than 32.5 percent by volume of a carrying agent selected from the group consisting of gelatin, polyvinyl alcohol, polyacrylamide, and other water swellable hydrocolloids said product exhibiting increased photographic density and contrast as compared with the same image prior to such treatment, the said product being formed by bleaching said silver image with an alkali metal hypochlorite and having another metal plated thereon by electroless deposition, and the metal plated thereon being selected from the group consisting of nickel, cobalt, iron, copper, chromium, gold, silver, platinum, palladium and mixtures thereof.

2. The product of claim 1 wherein the base is silver impregnated anodized aluminum.

3. The product of claim 2 wherein the base colloid is gelatin.

4. The product of claim 1 wherein the metal plated thereon defines a plated circuit and the product is a single-sided circuit board.

5. The product of claim 1 wherein both sides of the base are silver impregnated anodized aluminum.

6. The product of claim 1 wherein an aluminum metal base is prepunched to define holes prior to anodizing and the entire surface including the surfaces of the holes are anodized and a silver image is contained in said anodized layer.

7. The product of claim 6 wherein the metal plated thereon defines at least one plated circuit and the product is a two-sided circuit board.

* * * * *